(12) United States Patent
Delaey et al.

(10) Patent No.: US 10,261,142 B2
(45) Date of Patent: Apr. 16, 2019

(54) BORE REGION LIGHTING UNIT FOR MAGNETIC RESONANCE SCANNER

(71) Applicant: KONINKLIJKE PHILIPS N.V., Eindhoven (NL)

(72) Inventors: Tom Philippe Jean Jacques Delaey, Eindhoven (NL); Wee Kar Tan, Eindhoven (NL); Wei Lun Sun, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 157 days.

(21) Appl. No.: 15/319,083

(22) PCT Filed: Jun. 17, 2015

(86) PCT No.: PCT/EP2015/063621
§ 371 (c)(1),
(2) Date: Dec. 15, 2016

(87) PCT Pub. No.: WO2015/197451
PCT Pub. Date: Dec. 30, 2015

(65) Prior Publication Data
US 2017/0131370 A1    May 11, 2017

(30) Foreign Application Priority Data

Jun. 26, 2014  (WO) ................ PCT/CN2014/080829
Aug. 15, 2014  (EP) .................................... 14181175

(51) Int. Cl.
*G01R 33/28*     (2006.01)
*F21V 33/00*    (2006.01)
*F21V 3/00*     (2015.01)
*G01R 33/54*    (2006.01)
*F21W 131/20*   (2006.01)

(52) U.S. Cl.
CPC .............. *G01R 33/288* (2013.01); *F21V 3/00* (2013.01); *F21V 33/0068* (2013.01); *G01R 33/28* (2013.01); *G01R 33/546* (2013.01); *F21W 2131/20* (2013.01)

(58) Field of Classification Search
CPC .... G01R 33/288; G01R 33/546; G01R 33/28; F21V 3/00; F21V 33/0068; F21W 2131/20
See application file for complete search history.

(56) References Cited

U.S. PATENT DOCUMENTS 4,613,926 A * 9/1986 Heitman ................ G01R 33/28
                                                362/248
5,355,885 A * 10/1994 Tsuda ..................... G01R 33/28
                                                324/309
7,999,546 B2 * 8/2011 Trowell ................. G01R 33/28
                                                324/307

(Continued)

*Primary Examiner* — G. M. A Hyder (57) ABSTRACT

A magnetic resonance imaging system (10) includes a scanner unit (12) including a main magnet with a magnet bore (16), and a bore region lighting unit (28) including lighting members (32, 36), which is configured for generating lighting conditions at a bore region (26) by using the lighting members (32, 36), for influencing the subject of interest's optical perception regarding a radial dimension (b) of the magnet bore (16) by at least one out of detracting the subject of interest's attention, generating an optical illusion in connection with the radial dimension (b) of the magnet bore (16) and camouflaging the magnet bore (16).

11 Claims, 7 Drawing Sheets

(56) References Cited

U.S. PATENT DOCUMENTS

| | | | | |
|---|---|---|---|---|
| 8,083,389 B2* | 12/2011 | Helmreich | ............ | A61B 5/055 |
| | | | | 362/253 |
| 9,532,727 B2* | 1/2017 | Herold | ................ | A61B 5/055 |
| 2003/0128034 A1* | 7/2003 | Haumann | ............ | A61B 5/055 |
| | | | | 324/318 |
| 2005/0004444 A1 | 1/2005 | Boninger et al. | | |
| 2005/0254256 A1* | 11/2005 | Gosswein | ............ | A61B 5/0555 |
| | | | | 362/572 |
| 2009/0080186 A1 | 3/2009 | Helmreich et al. | | |
| 2014/0266204 A1* | 9/2014 | Watanabe | ............ | A61B 5/055 |
| | | | | 324/318 |
| 2015/0196367 A1* | 7/2015 | Muller | ................ | A61B 6/032 |
| | | | | 600/410 |

* cited by examiner

BORE REGION LIGHTING UNIT FOR MAGNETIC RESONANCE SCANNER

CROSS REFERENCE TO RELATED APPLICATIONS

This application is a U.S. national phase application of International Application No. PCT/EP2015/063621 filed on Jun. 17, 2015 which claims the benefit of PCT/CN2014/080829, filed on Jun. 26, 2014 and EP14181175.2 filed on Aug. 15, 2014 and are incorporated herein by reference.

FIELD OF THE INVENTION

The invention pertains to a magnetic resonance imaging system having a magnet bore and a bore region lighting unit, and to a bore region lighting unit for use in a magnetic resonance imaging system.

BACKGROUND OF THE INVENTION

In the field of magnetic resonance imaging, the use of bore-type magnetic resonance scanners is widespread. Although lateral dimensions of the magnet bore have been enlarged in the past years, it is known that the limited bore dimension can increase patient anxiety even without the presence of an explicit claustrophobic disposition. Increased patient anxiety or a feeling of upcoming panic can disturb the acquiring of magnetic resonance images or even make its execution unfeasible.

Illumination assemblies for lighting the magnet bore for enhancing patient comfort are known, for instance, from U.S. Pat. No. 4,613,926, wherein plastic fiber optic bundles with ends in frosted tubes are arranged in the magnet bore behind a deflector element to uniformly diffuse light provided by the plastic fiber optic bundles.

Japanese patent application JP 2013 163018 A describes a magnetic resonance imaging device that includes a gantry unit, front light sources, and an outer casing for the gantry unit. The gantry unit has a bore serving as a space where a magnetic resonance image is to be captured, and is configured to collect magnetic resonance signals from a subject placed on a patient bed top in a state in which the subject has been moved into the bore by a bed unit for moving the patient bed top. The front light sources are installed around a front opening that is an opening of the bore and is located in front of the bed unit. The outer casing of the gantry unit, a portion of which is illuminated with light applied from the front light sources, is made of a transparent or translucent material. By providing the front light sources, it is possible to make the portion of the cover positioned near the front opening brighter than the surroundings thereof. Because the portion of the cover positioned near the front opening is illuminated, the subject feels that the front opening is large, while the subject is moved into the bore.

International application WO 2014/029571 A describes a medical device with a tubular interior space for accommodating a subject to be examined, a cladding of the tubular interior space facing towards the subject to be examined and a device for lighting the tubular interior space, which comprises at least one lamp, wherein the lamp is mounted on the side of the cladding of the tubular interior space facing towards the subject to be examined and forms the tunnel contour of the tubular interior space.

SUMMARY OF THE INVENTION

It is therefore desirable to prevent any intimidating and negative feelings of the subject of interest to be imaged that might be triggered at the sight of the magnet bore of the magnetic resonance scanner unit, so as to not to affect the acquiring of planned magnetic resonance images.

It is therefore an object of the invention to provide a magnetic resonance imaging system which has a magnet bore and which does not provoke any of the described unfavorable feelings at the subject of interest.

In one aspect of the present invention, the object is achieved a magnetic resonance imaging system configured for acquiring magnetic resonance images of at least a portion of a subject of interest, comprising:
 a scanner unit, including
  a main magnet with a magnet bore arranged along a center axis, wherein the main magnet is configured for generating a static magnetic field $B_0$ at least in the magnet bore,
  an examination space provided within the magnet bore for positioning at least the portion of the subject of interest in the examination space during acquiring the magnetic resonance images;
  a bore cover arranged within the magnet bore, wherein the bore cover delimits the examination space perpendicularly with regard to the center axis; and
  a front cover having an opening about the center axis provided for the subject of interest to enter the examination space for positioning at least the portion of the subject of interest within the examination space;
 a bore region lighting unit comprising lighting members, which is configured for generating lighting conditions at a bore region
  such that a spatially gradually varying distribution of an area-averaged brightness-related photometric parameter is generated at the bore region for at least a continuous range of an azimuth angle about the center axis when at least part of the lighting members are switched on and/or
  wherein at least part of the lighting members are arranged in a regular pattern at an outer surface of the front cover.

Lighting members of the bore region lighting unit arranged at the front cover are configured, in at least one state of operation, for generating lighting conditions at the front cover.

At locations in azimuthally arranged annular regions of a virtual plane that is arranged perpendicularly to the center axis and in front of the front cover, the area-averaged brightness-related photometric parameter decreases in a radial direction towards the center axis at least for the continuous range of the azimuth angle about the center axis.

Alternatively, the bore region lighting unit includes a bore cover lighting unit comprising at least one lighting member arranged at the bore cover that is configured, in at least one state of operation, for generating lighting conditions at the bore cover. If the bore cover is at least partially illuminated by the bore cover lighting unit, the area-averaged brightness-related photometric parameter increases, at locations in the azimuthally arranged annular regions of the virtual plane, in the radial direction towards the center axis at least for the continuous range of the azimuth angle about the center axis.

The phrase "bore region", as used in this application, shall be understood particularly to encompass the bore, the bore cover and a portion of the front cover which is adjacent to the opening and a proximal end of the bore. A width of the portion of the front cover shall preferably be wider than 20%, more preferable wider than 30% and, most preferable, more than 50% of the total width of the front cover.

The phrase "lighting members", as used in this application, shall be understood particularly to encompass bulb-type light sources, optical fiber ends and light-emitting diodes (LEDs) as well as translucent portions of an otherwise opaque material that are illuminated from behind.

The continuous range of the azimuth angle about the center axis is preferably between $\pi/2$ and $2\pi$ and more preferably between $\pi$ and $2\pi$.

In this way, the dimension of the bore region is either not in the focus of the subject of interest's attention anymore, or the dimension of the bore region appears to be larger in the perception of the subject of interest. Lighting conditions suitable for detracting the subject of interest's attention or for influencing the subject of interest's optical perception regarding the dimension of the magnet bore can readily be generated. By that, any feelings of anxiety, intimidation or discomfort that may be coming up in the subject of interest at the sight of the bore region can be avoided. The subject of interest can be positioned within the examination space in a more relaxed condition, and an improved cooperation of the subject of interest can be accomplished as an important pre-requisite for an undisturbed acquisition of magnetic resonance images. Obviously, influencing the subject of interest's optical perception is of special importance prior to being positioned within the examination space.

By means of lighting members, which are configured for generating lighting conditions at a bore region such that a spatially gradually varying distribution of an area-averaged brightness-related photometric parameter is generated on an interface between the front cover and bore cover for at least a continuous range of an azimuth angle about the center axis when at least part of the lighting members are switched on, optical sharp edges between darker and lighter regions can be decreased or avoided on the interface between the front cover and bore cover. This will optically enlarge the radial dimension of the bore, which in turn may decrease anxiety in the subject of interest. Preferably the light distribution extends over a width of the portion of the front wider than 20%, more preferable wider than 30% and, most preferable, more than 50% of the total width of the front cover.

This effect of optically enlarging the bore could for example be achieved by gradually decreasing the area-averaged brightness-related photometric parameter in a radial direction towards the center axis when there is no bore lighting or dimmed lighting in the bore. This effect could for example also be achieved by both lighting (part of) the bore and (portion of) the front cover. This effect could also be achieved by the use of some regular patterns, for example by the use of regular dots or concentric circles with radially decreasing averaged brightness-related photometric parameter towards the central axis when there is no bore lighting or dimmed lighting in the bore. This could for example be achieved by decreasing the light intensity of single dots towards the center axis or by decreasing the density of dots towards the center axis. Also for example the effect could be achieved by increasing the area-averaged brightness-related photometric parameter of the dots or concentric circles radially towards the central axis, when the bore cover is also lighted. These measures achieve that optical sharp edges between darker and lighter regions are decreased or avoided on the interface between the front cover and bore cover.

The front cover and the bore cover may be designed such that their outer surfaces form a smooth transition. In this case, the front cover shall be understood to begin where a radial dimension of the outer surface with regard to center axis is increased compared to the dimension of the bore cover surface.

According to another embodiment, the bore region lighting unit comprises only the front cover lighting.

In another preferred embodiment, the front cover is at least partially made from a translucent material that, in at least one state of operation, is illuminated by the bore cover lighting unit from behind. The phrase "at least partially", as used in this application, shall be understood particularly to also encompass that the front cover is completely made from a translucent material. In this way, a shadeless illumination of the front cover, in particular the front cover region adjacent to the proximal end of the bore cover, can be accomplished. By that, the optical illusion of an increased radial dimension of the magnet bore can be generated for the subject of interest.

In yet another preferred embodiment, both the front cover and the bore cover are at least partially made from a translucent material, wherein, in at least one state of operation, the front cover is illuminated from behind by the front cover lighting unit, and the bore cover is illuminated from behind by the bore cover lighting unit.

In yet another preferred embodiment, the front cover lighting unit comprises a plurality of lighting members that are arranged in a regular pattern at an outer surface of the front cover. In this way, the subject of interest's attention can readily be detracted from the radial dimension of the magnet bore and/or the magnet bore can be camouflaged by the lighting members.

In one embodiment, the front cover is completely made from a translucent or transparent material and, in at least one state of operation, is illuminated by a light source of the bore cover lighting unit from behind. An opaque foil is attached to either the front surface or the rear surface of the front cover, and the lighting members are realized by apertures in the opaque foil.

Preferably, the regular pattern is arranged within at least one continuous angular segment of the full circle about the center axis. In this manner, the subject of interest's attention can effectively be detracted from the radial dimension of the magnet bore by furnishing the front cover with lighting members in the one continuous angular segment of the full circle only.

In one embodiment, a first regular pattern is arranged within a first continuous segment of the full circle, and a second regular pattern is arranged within a second continuous segment of the full circle, which is distinct from the first continuous segment. The first continuous segment and the second continuous segment may build up a full circle about the center axis, or they may form only a segment of the full circle. By that, viable options of generating lighting conditions at the bore region can be provided.

If a shape of the lighting members at the outer surface of the front cover is selected from a group consisting of circular dots, radially arranged stripes and azimuthally arranged stripes, lighting conditions can be generated that effectively detract the subject of interest's attention from the radial dimension of the magnet bore. The terms "radially" and "azimuthally", as used in this application, shall be understood particularly as referring to a cylindrical coordinate system with regard to the center axis forming the z-axis.

In another preferred embodiment, a photometric parameter of each lighting member of the front cover lighting unit increases or decreases depending on a radial distance of the lighting member to the center axis. It is noted that photometric parameters are based on the luminosity function, which is a standardized model of the sensitivity of the human eye. In this way, lighting conditions can be generated that create an optical illusion in connection with the lateral dimension of the magnet bore. The luminous flux of the lighting members, expressed in lumen, can serve as a suitable brightness-related photometric parameter. The brightness-related photometric parameter may be the illuminance, expressed in lux=lumen/m². Generally, other photometric parameters that appear suitable to the one skilled in the art might be used instead.

In the case of distinct lighting members, the area over which the brightness-related photometric parameter is to be averaged may be selected based on a distance between the lighting members. For instance, the area could be given by the area of the azimuthally arranged annular regions which are selected such that each annular region covers a specified number of lighting members. Preferably, each annular region covers at least two lighting members, more preferably at least five lighting members, and, most preferably, at least ten lighting members.

In this way, an optical illusion can be generated in connection with the radial dimension of the magnet bore due to the fact that the illumination of the bore cover appears to be extended to the front cover, masking a transition region between the bore cover and the front cover, so as to make it more difficult for the subject of interest to distinguish between them, which consequently lets the subject of interest optically perceive the radial dimension of the magnet bore being larger than it actually is.

In another preferred embodiment, a first derivative of an area-averaged brightness-related photometric parameter function, taken with respect to a radial direction towards the center axis, is continuous in the mathematical sense for locations on a virtual plane that is arranged perpendicularly to the center axis and in front of the front cover, at least in a radial interval given by the distance of an outermost lighting member of the bore region lighting unit from the center axis and a radial dimension of the bore cover for at least a continuous range of an azimuth angle about the center axis. By that, shadows or dark/light contrast zones in the bore region can be avoided, effectively masking the transition region between the bore cover and the front cover, and making the generated optical illusion in connection with the radial dimension of the magnet bore even more convincing to the subject of interest.

In particular, a maximum of the area-averaged brightness-related photometric parameter may be located outside the magnet bore, on the front cover surface, influencing the subject of interest's optical perception towards a larger radial dimension of the magnet bore.

In one embodiment, the bore region lighting unit is configured, in at least one state of operation, to dynamically switch at least one of the lighting members between an illuminated on-state and an extinguished off-state of the lighting member. In this way, the subject of interest's attention can effectively be detracted from the radial dimension of the magnet bore.

In another embodiment, the same effect can be accomplished if the bore region lighting unit is configured, in at least one state of operation, to at least initiate a change of a color of at least one of the lighting members. For instance, the at least one lighting member may comprise a multi-color light emitting diode, and the bore region lighting is configured to actuate the LED to emit light of a different color.

In another aspect of the invention, a bore region lighting unit is provided for use in a magnetic resonance imaging system, wherein the magnetic resonance imaging system is configured for acquiring magnetic resonance images of at least a portion of a subject of interest. Further, the magnetic resonance imaging system comprises a scanner unit which includes a main magnet with a magnet bore arranged along a center axis. The main magnet is configured for generating a static magnetic field $B_0$ at least in the magnet bore, further comprises an examination space provided within the magnet bore for positioning at least the portion of the subject of interest in the examination space, a bore cover arranged within the magnet bore, wherein the bore cover delimits the examination space perpendicularly with regard to the center axis, and furthermore comprises a front cover having an opening about the center axis provided for the subject of interest to enter the examination space for positioning at least the portion of the subject of interest within the examination space.

The bore region lighting unit comprises lighting members and is configured for generating lighting conditions at a bore region such that a spatially gradually varying distribution of an area-averaged brightness-related photometric parameter is generated at the bore region for at least a continuous range of an azimuth angle about the center axis when at least part of the lighting members are switched on and/or at least part of the lighting members are arranged in a regular pattern at an outer surface of the front cover.

Lighting members of the bore region lighting unit arranged at the front cover are configured, in at least one state of operation, for generating lighting conditions at the front cover.

At locations in azimuthally arranged annular regions of a virtual plane that is arranged perpendicularly to the center axis and in front of the front cover, the area-averaged brightness-related photometric parameter decreases in the radial direction towards the center axis at least for the continuous range of the azimuth angle about the center axis.

Alternatively, the bore region lighting unit includes a bore cover lighting unit comprising at least one lighting member arranged at the bore cover that is configured, in at least one state of operation, for generating lighting conditions at the bore cover, the area-averaged brightness-related photometric parameter increases, at locations in the azimuthally arranged annular regions of the virtual plane, in the radial direction towards the center axis at least for the continuous range of the azimuth angle about the center axis, if the bore cover is at least partially illuminated by the bore cover lighting unit.

With regard to further embodiments of the bore region lighting unit in accordance with the invention, reference is explicitly made herewith to the disclosure of the magnetic resonance imaging system in accordance with the invention. Features described before for the bore region lighting unit of the magnetic resonance imaging system are understood to be also applicable to the bore region lighting unit in accordance with the invention and shall be considered to be disclosed for the bore region lighting unit itself as well.

BRIEF DESCRIPTION OF THE DRAWINGS

These and other aspects of the invention will be apparent from and elucidated with reference to the embodiments described hereinafter. Such embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
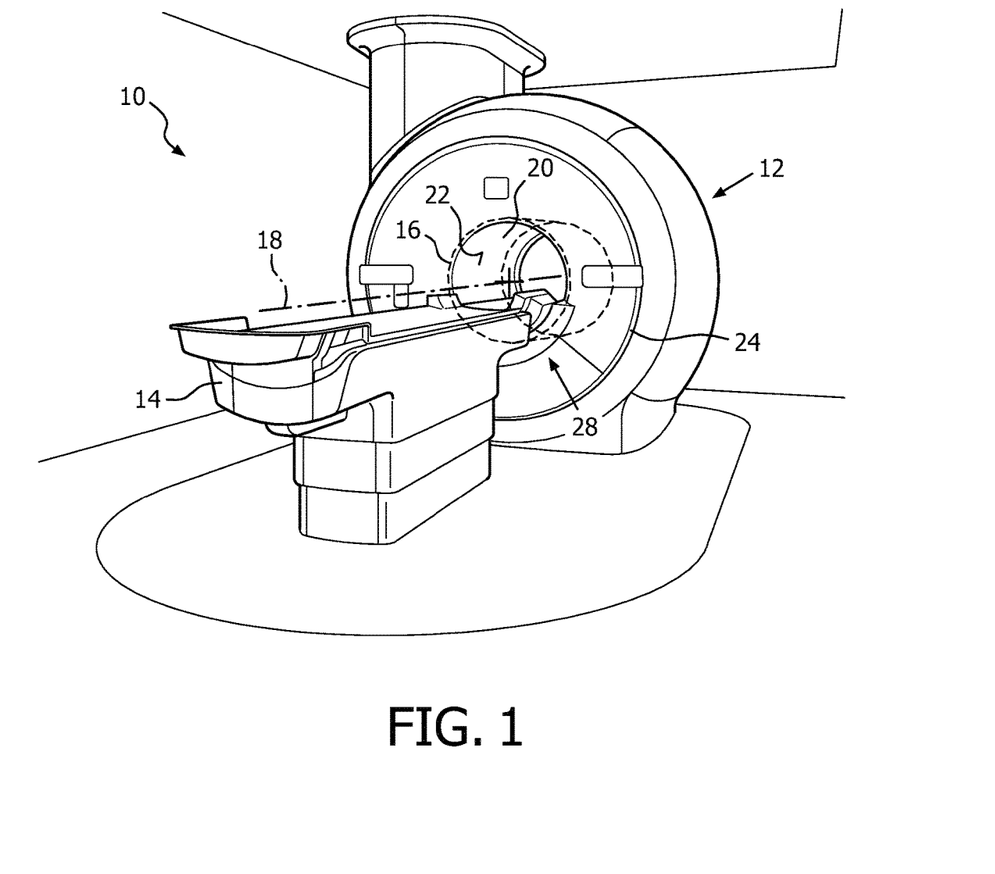
FIG. 1 shows a schematic illustration of an embodiment of a magnetic resonance imaging system in accordance with the invention.

FIG. 1 shows a partial schematic view of an embodiment of a magnetic resonance imaging system 10 in accordance with the invention. The magnetic resonance imaging system 10 is configured for acquiring magnetic resonance images of at least a portion of a subject of interest and comprises a scanner unit 12. The scanner unit 12 includes a superconducting main magnet with a magnet bore 16 arranged along a center axis 18. The main magnet is configured for generating a static, homogeneous magnetic field $B_0$ in the magnet bore 16, in which an examination space 20 is provided for positioning at least the portion of the subject of interest within during acquiring the magnetic resonance images. The examination space 20 is of cylindrical shape. An axis of symmetry of the examination space 20 coincides with the center axis 18. For delimiting the examination space 20 from the magnet bore 16 in directions arranged perpendicularly with regard to the center axis 18, a protective bore cover 22 is arranged within the magnet bore 16.

The magnetic resonance imaging system 10 further includes a magnetic gradient coil system configured for generating gradient magnetic fields superimposed to the static magnetic field $B_0$, a radio frequency transmitter antenna configured for applying a radio frequency excitation field $B_1$ to nuclei of or within the portion of the subject of interest for magnetic resonance excitation, a radiofrequency receiver antenna configured for receiving magnetic resonance signals from the nuclei of or within the portion of the subject of interest that have been excited by applying the radio frequency excitation field $B_1$, a patient table 14 for supporting the subject of interest and for positioning the subject of interest within the examination space, and a control unit configured for controlling functions of the magnetic resonance imaging system 10 and including a signal processing unit. All these components are well known in the field of magnetic resonance imaging and will therefore neither be discussed in more detail nor shown in the figures herein.

Figure 2:
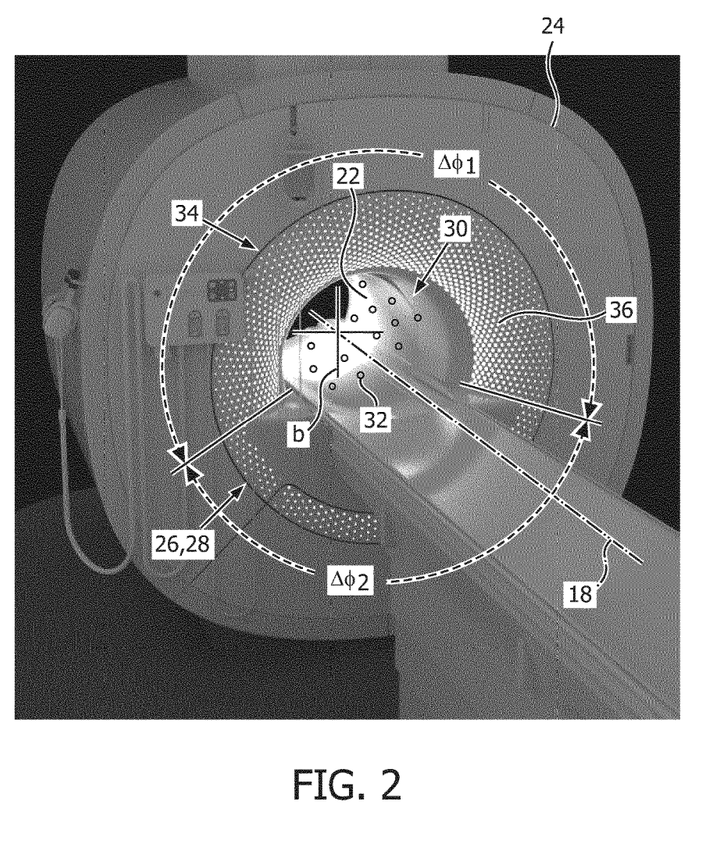
FIG. 2 illustrates the magnetic resonance imaging system pursuant to FIG. 1 with a bore region lighting unit in accordance with the invention.

The scanner unit 12 further includes a convex-shaped front cover 24 having an opening about the center axis 18 provided for the subject of interest to enter the examination space 20 for positioning the portion of the subject of interest to be imaged within the examination space 20. As is shown in FIG. 2, an outer surface of the front cover 24 and an outer surface of the bore cover 22 are designed to form a smooth transition. A bore region 26 includes the bore cover 22 and a portion of the front cover 24 following the bore cover 22 and extending to about 50% of the width of the front cover 24. The front cover 24 is made from a translucent plastic material. An opaque foil whose function will be described in the following is attached to the rear surface of the front cover 24.

Although the embodiments are described to include a convex-shaped front cover, it is readily acknowledged by the one skilled in the art that the front cover may as well have a flat shape.

FIG. 2 illustrates a part of the magnetic resonance imaging system 10 pursuant to FIG. 1 with a bore region lighting unit 28 in accordance with the invention. The bore region lighting unit 28 comprises lighting members 32, 36 and is configured for generating lighting conditions at the bore region 26 by using the lighting members 32, 36. The bore region lighting unit 28 includes a bore cover lighting unit 30 and a front cover lighting unit 34.

The bore cover lighting unit 30 comprises lighting members 32 formed by optical fiber ends that emit light provided by an external light source (not shown). The lighting members 32 are arranged behind the translucent bore cover 22. The bore cover lighting unit 30 is configured, in at least one state of operation, for generating lighting conditions at the bore cover 22.

The front cover lighting unit 34 includes lighting members 36 and is configured, in at least one state of operation, for generating lighting conditions at the front cover 24. The lighting members 36 are formed by a plurality of apertures in the opaque foil attached at the rear surface of the translucent front cover 24. The apertures are formed as circular dots of varying size and are arranged in the front cover portion of the bore region 26. In at least one state of operation, the front cover 24 can be illuminated from behind by light sources of the front cover lighting unit 34 formed by light emitting diodes, so that the lighting members 36 of the front cover lighting unit 34 appear as circular light dots. As illustrated in FIG. 2, the lighting members 36 of the front cover lighting unit 34 are arranged in a regular pattern at the outer surface of the front cover 24. In a cylindrical coordinate system whose z-axis is given by the center axis 18, the regular pattern of the lighting members 36 consists of two continuous angular segments $\Delta\phi_1$, $\Delta\phi_2$ of the full circle about the center axis 18.

The size of the circular apertures in the opaque foil is designed to increase in a direction towards the magnet bore 16, i.e. with decreasing radial distance r to the center axis 18. Thus, the photometric parameter given by the luminous flux of each lighting member 36 of the front cover lighting unit 34 depends on the radial distance r of the lighting member 36 to the center axis 18, namely in that it increases with decreasing radial distance r. Consequently, regions of the front cover 24 that are closer to the magnet bore 16 appear brighter than regions further away.

If in the embodiment pursuant to FIG. 2 a lighting condition at the bore region 26 is generated in which the bore cover 22 is uniformly illuminated by the bore cover lighting unit 30 and the front cover lighting unit 34 is activated, the subject of interest's optical perception regarding a radial dimension b of the magnet bore 16 is being influenced by generating an optical illusion and by camouflaging the magnet bore 16 with light in the way that the radial dimension b of the magnet bore 16 appears to be larger than it actually is.

In the following, several embodiments of a bore region lighting unit in accordance with the invention are disclosed.

The individual embodiments are identified by a prefix number of the particular embodiment. Features whose function is the same or basically the same in all embodiments are identified by reference numbers made up of the prefix number of the embodiment to which it relates, followed by the number of the feature. If a feature of an embodiment is not described in the corresponding figure depiction, or a reference number mentioned in a figure depiction is not shown in the figure itself, reference should be made to the description of one of the preceding embodiments.

Figure 3:
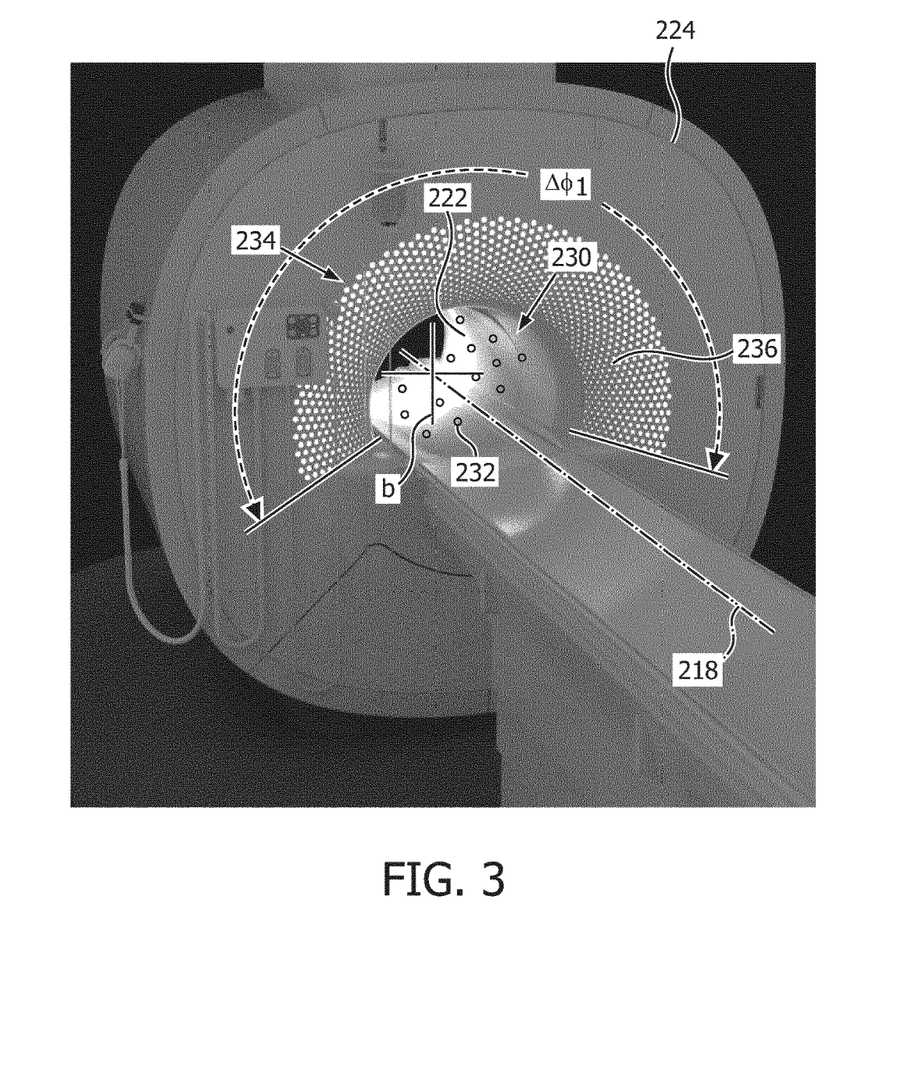
FIG. 3 illustrates the magnetic resonance imaging system pursuant to FIG. 2 furnished with an alternative embodiment of a bore region lighting unit in accordance with the invention.

In the alternative embodiment of the bore region lighting unit 228 illustrated in FIG. 3, the camouflaging of the magnet bore 216 with light is carried out to the same effect in the opposite manner. Here, the size of the circular apertures in the opaque foil is designed to decrease in a direction towards the magnet bore 216, i.e. with decreasing radial distance r to the center axis 218. Thus, the photometric parameter given by the luminous flux of each lighting member 236 of the front cover lighting unit 234 depends on the radial distance r of the lighting member 236 to the center axis 218 in that it decreases with decreasing radial distance r. Consequently, regions of the front cover 224 that are closer to the magnet bore 216 appear darker than regions further away. In this embodiment, this is combined with the bore cover lighting unit 230 being turned down, so that the subject of interest's optical perception regarding the radial dimension b of the magnet bore 216 is being influenced by generating an optical illusion and by camouflaging the magnet bore 216 in the way that the radial dimension b of the magnet bore 216 appears to be larger than it actually is.

Figure 4:
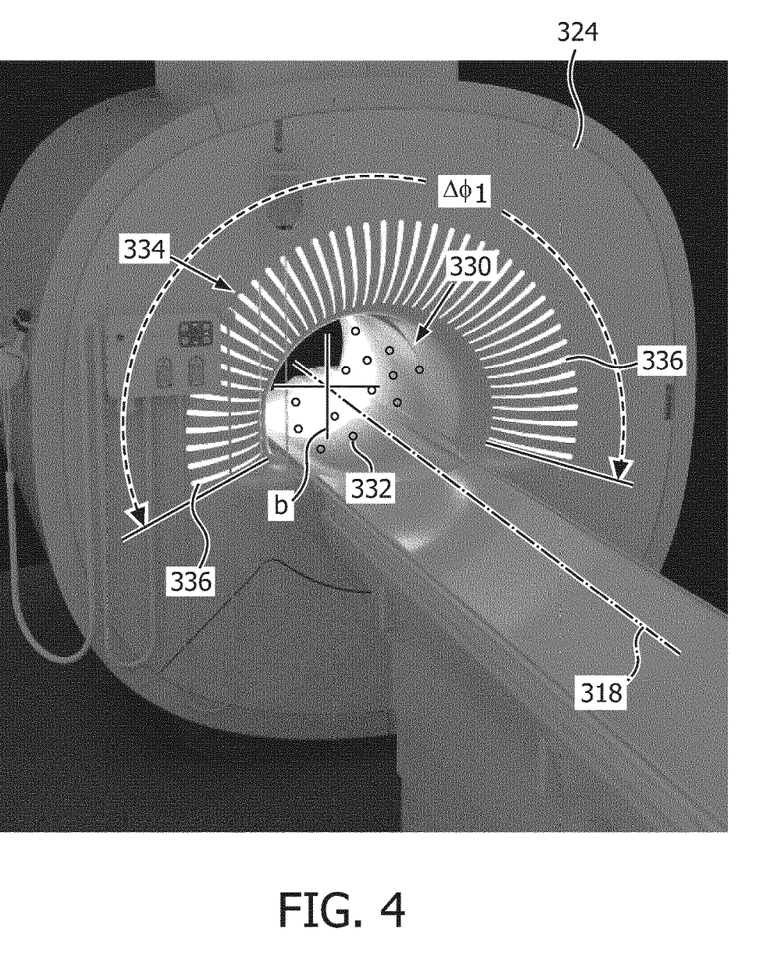
FIG. 4 illustrates the magnetic resonance imaging system pursuant to FIG. 2 furnished with an alternative embodiment of a bore region lighting unit in accordance with the invention.

In the alternative embodiment of a bore region lighting unit 328 shown in FIG. 4, a shape of lighting members 336 at the outer surface of the front cover 324 is designed as a radially arranged stripe. The lighting members 336 are formed by a plurality of apertures in an opaque foil attached to the rear surface of the translucent front cover 324. A stripe width of each lighting member 336 decreases with decreasing radial distance r to the center axis 318, so that regions of the front cover 324 that are closer to the magnet bore 316 appear darker than regions further away. In combination with a turned down bore cover lighting unit 330, the same influencing of the subject of interest's optical perception regarding a radial dimension b of the magnet bore 316 is accomplished as in the embodiment pursuant to FIG. 3.

In a similar way, without illustrating the embodiment, the one skilled in the art will acknowledge that if the stripe width of each lighting member increases with decreasing radial distance to the center axis, so that regions of the front cover that are closer to the magnet bore appear brighter than regions further way, and in combination with a lighting condition at the bore region in which the bore cover is uniformly illuminated by the bore cover lighting unit, a camouflaging effect can be achieved that influences the subject of interest's optical perception with regard to the radial dimension of the magnet bore in the way that the radial dimension of the magnet bore appears to be larger than it actually is.

Figure 5:
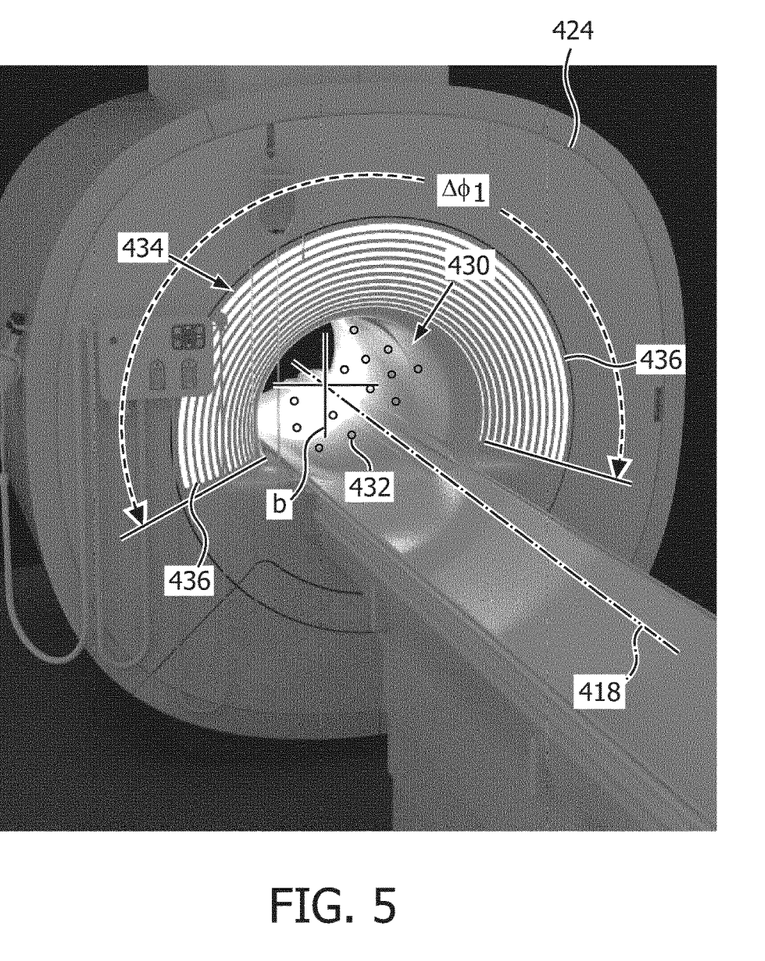
FIG. 5 illustrates the magnetic resonance imaging system pursuant to FIG. 2 furnished with an alternative embodiment of a bore region lighting unit in accordance with the invention.

In another alternative embodiment of a bore region lighting unit 428 shown in FIG. 5, a shape of lighting members 436 at the outer surface of the front cover 424 is designed as an azimuthally arranged stripe whose width is constant along an azimuthal angle. The lighting members 436 are formed by a plurality of apertures in an opaque foil attached to the rear surface of the translucent front cover 424. The stripe width of the lighting members 436 decreases with decreasing radial distance r to the center axis 418, so that regions of the front cover 424 that are closer to the magnet bore 416 appear darker than regions further away. In combination with a turned down bore cover lighting unit 430, the same influencing of the subject of interest's optical perception regarding a radial dimension b of the magnet bore 416 is accomplished as in the embodiments pursuant to FIGS. 3 and 4.

In a more quantitative approach, the embodiments of a bore region lighting unit 228, 328, 428 pursuant to FIGS. 3, 4 and 5 can be described by introducing a virtual plane 38 (FIG. 6) that is arranged perpendicularly to the center axis 18 and in front of the front cover 24, and by analyzing a brightness-related photometric parameter for locations in azimuthally arranged annular regions 40 of the virtual plane 38 and at the described generated lighting conditions. The brightness-related photometric parameter is given by the illuminance I, expressed in lux=lumen/m². For each annular region 40, the illuminance I created by the generated lighting condition is averaged over the area of the annular region 40 to obtain an area-averaged illuminance $\hat{I}$. The radial width 42 of each of the annular regions 40 is selected such that at least ten dot-shaped lighting members 36 of the front cover lighting unit 34 are covered by each annular region 40.

Figure 6:
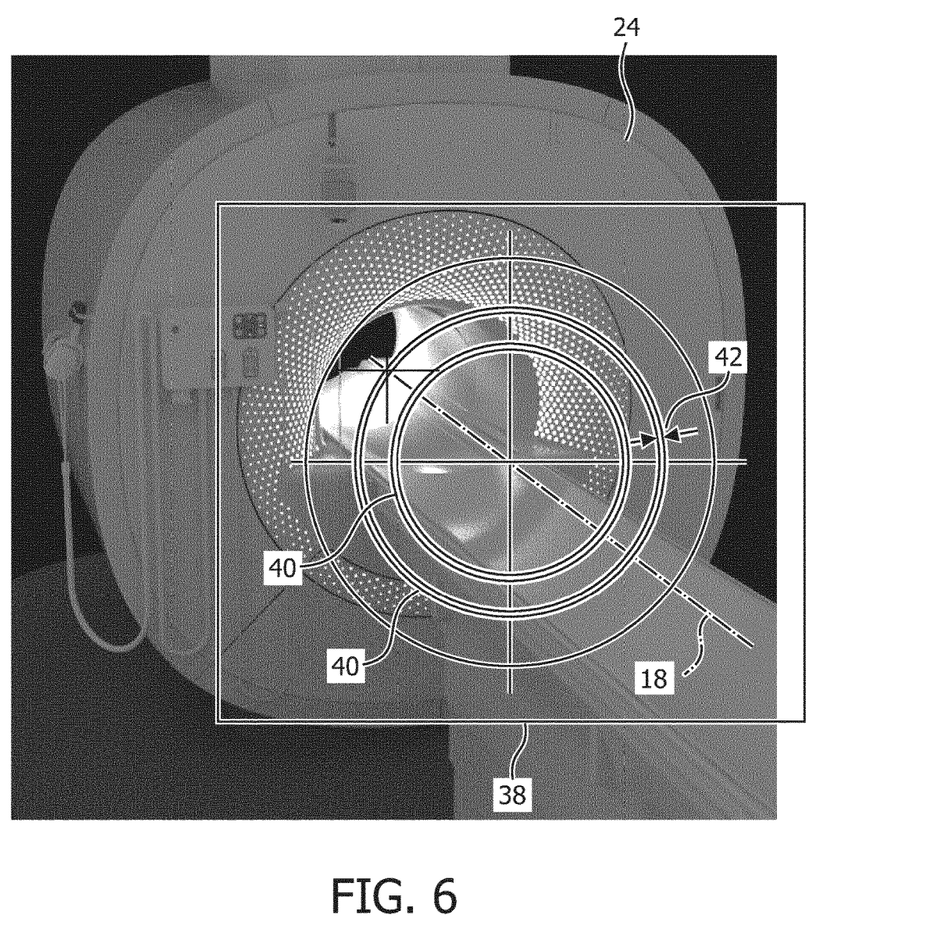
FIG. 6 illustrates the magnetic resonance imaging system pursuant to FIG. 2 with a virtual plane for analyzing a photometric parameter.

The area-averaged illuminance $\hat{I}$ increases in the radial direction towards the center axis 18 for a continuous range $\Delta\phi_1$ of the azimuthal angle about the center axis 18 if the bore cover 22 is illuminated (in this embodiment: uniformly illuminated) by the bore cover lighting unit 30.

The same virtual plane introduced in the embodiment illustrated by FIG. 3 would reveal that the area-averaged illuminance $\hat{I}$ decreases in the radial direction towards the center axis 218 for a continuous range $\Delta\phi$ of an azimuthal angle about the center axis 218 if the bore cover lighting unit 230 is turned down or off.

The embodiments of the front cover lighting units 234, 334, 444 pursuant to FIGS. 3 to 5 comprised distinct lighting members 236, 336, 436. In another alternative embodiment (not shown), a front cover is made from a translucent plastic material. The front cover lighting unit comprises light sources arranged behind the front cover as lighting members. The plastic material of the front cover is sufficiently opaque to scatter light emitted by the light sources such that no details of the light source are visible from the outside. A bore cover lighting unit comprises lighting members formed by optical fiber ends that emit light provided by an external light source. The lighting members are arranged behind a translucent bore cover and generate lighting condition of homogeneous illumination at the bore cover.

The concept of introducing a virtual plane that is arranged perpendicularly to the center axis and in front of the front cover, and analyzing a brightness-related photometric parameter given by the illuminance I for locations in azimuthally arranged annular regions of the virtual plane and at the described generated lighting conditions can also be applied for this embodiment. If a radial width of the azimuthally arranged annular regions was selected sufficiently small, one would find that a first derivative of an illuminance function I, taken with respect to a radial direction towards the center axis, is continuous, in the mathematical sense, in the radial interval given by the distance of the outermost lighting member of the bore region lighting unit from the center axis and a radial dimension b of the bore cover for a continuous range of an azimuth angle about the center axis.

Figure 7:
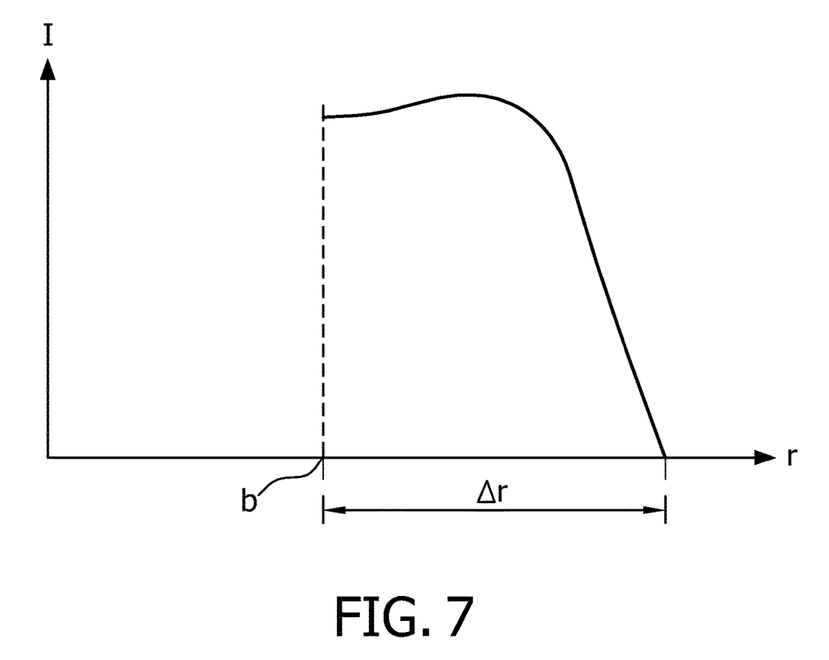
FIG. 7 illustrates an illuminance function of a bore region lighting unit in accordance with the invention.

An example for such an illuminance function I is given in FIG. 7, showing that shadows or any dark/light contrast zones are avoided in the bore region. A maximum of the illuminance function I is located at a radial coordinate r arranged outside the magnet bore, which makes the generated optical illusion in connection with the radial dimension b of the magnet bore very convincing to the subject of interest and effectively influences the subject of interest's optical perception regarding the radial dimension b of the magnet bore.

In variations of the embodiments pursuant to FIGS. 2 to 5, the bore region lighting unit is configured, in at least one state of operation, to dynamically switch selected lighting members of the front cover lighting unit between an illuminated on-state and extinguished of-state of the lighting member. In one variation, the dynamically switching comprises initiating the change of a color of the selected lighting members of the front cover lighting unit. In this way, the optical perception of the subject of interest regarding the radial dimension of the magnet bore is influenced by detracting the subject of interest's attention towards the dynamically switched lighting members and the color-changing lighting members, respectively.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

REFERENCE SYMBOL LIST 10 magnetic resonance imaging system
12 scanner unit
14 patient table
16 magnet bore
18 center axis
20 examination space
22 bore cover
24 front cover
26 bore region
28 bore region lighting unit
30 bore cover lighting unit
32 lighting member
34 front cover lighting unit
36 lighting member
38 virtual plane
40 annular region
42 radial width
$B_0$ static magnetic field
$B_1$ radio frequency excitation field
B magnet bore radial dimension
I illuminance
R radial distance
$\Delta\phi$ angular segment

The invention claimed is:

1. A magnetic resonance imaging system configured for acquiring magnetic resonance images of at least a portion of a subject of interest, comprising:
    a scanner unit, including
        a main magnet with a magnet bore arranged along a center axis, wherein the main magnet is configured for generating a static magnetic field $B_0$ at least in the magnet bore,
        an examination space provided within the magnet bore for positioning at least the portion of the subject of interest in the examination space during acquiring the magnetic resonance images;
        a bore cover arranged within the magnet bore, wherein the bore cover delimits the examination space perpendicularly in a radial direction with regard to the center axis; and
        a front cover having an opening about the center axis provided for the subject of interest to enter the examination space for positioning at least the portion of the subject of interest within the examination space;
    a bore region lighting unit comprising lighting members, which is configured for generating lighting conditions at a bore region,
    wherein lighting members of the bore region lighting unit arranged at the front cover are configured, in at least one state of operation, for generating lighting conditions at the front cover, and
    wherein, at locations in azimuthally arranged annular regions of a virtual plane that is arranged perpendicularly to the center axis and in front of the front cover, an area-averaged brightness-related photometric parameter ($\hat{I}$) decreases in the radial direction towards the center axis at least for a continuous range ($\Delta\phi$) of the azimuth angle about the center axis, or
    wherein the bore region lighting unit includes a bore cover lighting unit comprising at least one lighting member arranged at the bore cover that is configured, in at least one state of operation, for generating lighting conditions at the bore cover, and wherein at locations in the azimuthally arranged annular regions of the virtual plane, the area-averaged brightness-related photometric parameter ($\hat{I}$) increases in the radial direction towards the center axis at least for the continuous range ($\Delta\phi$) of the azimuth angle about the center axis if the bore cover is at least partially illuminated by the bore cover lighting unit wherein each annular region covers a number of lighting members,
    wherein a shape of the lighting members at the outer surface of the front cover is selected from a group consisting of circular dots, radially arranged stripes and azimuthally arranged stripes.

2. The magnetic resonance imaging system of claim 1, wherein the front cover is at least partially made from a translucent material that, in at least one state of operation, is illuminated by the bore cover lighting unit from behind.

3. The magnetic resonance imaging system of claim 1, wherein the lighting members are arranged in a regular pattern within at least one continuous angular segment ($\Delta\phi1$, $\Delta\phi2$) of a full circle about the center axis.

4. The magnetic resonance imaging system of claim 1, wherein the photometric parameter (I, $\hat{I}$) of each lighting member of the front cover lighting unit increases or decreases depending on a radial distance (r) of the lighting member to the center axis.

5. The magnetic resonance imaging system of claim 1, wherein a first derivative of an area-averaged brightness-related photometric parameter function (I, $\hat{I}$), taken with respect to a radial direction towards the center axis, is continuous for locations on a virtual plane that is arranged perpendicularly to the center axis and in front of the front cover, at least in a radial interval (Δr) given by the distance of an outermost lighting member of the bore region lighting unit from the center axis and a radial dimension (b) of the bore cover for at least a continuous range (Δϕ) of an azimuth angle about the center axis.

6. The magnetic resonance imaging system of claim 1, wherein the bore region lighting unit is configured, in at least one state of operation, to dynamically switch at least one of the lighting members between an illuminated on-state and an extinguished off-state of the lighting member.

7. The magnetic resonance imaging of claim 1, wherein the bore region lighting unit is configured, in at least one state of operation, to at least initiate a change of a color of at least one of the lighting members.

8. The magnetic resonance imaging system as claimed in claim 1, wherein at least part of the lighting members are arranged in a regular pattern at an outer surface of the front cover.

9. The bore region lighting unit of claim 8, wherein at least part of the lighting members are arranged in a regular pattern of an outer surface of the front cover.

10. A bore region lighting unit for use in a magnetic resonance imaging system, wherein the magnetic resonance imaging system is configured for acquiring magnetic resonance images of at least a portion of a subject of interest and comprises a scanner unit having a main magnet with a magnet bore arranged along a center axis, wherein the main magnet is configured for generating a static magnetic field $B_0$ at least in the magnet bore, further comprises an examination space provided within the magnet bore for positioning at least the portion of the subject of interest in the examination space, a bore cover arranged within the magnet bore, wherein the bore cover delimits the examination space perpendicularly with regard to the center axis, and furthermore comprises a front cover having an opening about the center axis provided for the subject of interest to enter the examination space for positioning at least the portion of the subject of interest within the examination space, and wherein the bore region lighting unit comprises lighting members and is configured for generating lighting conditions at a bore region, wherein lighting members of the bore region lighting unit arranged at the front cover are configured, in at least one state of operation, for generating lighting conditions at the front cover, and wherein, at locations in azimuthally arranged annular regions of a virtual plane that is arranged perpendicularly to the center axis and in front of the front cover, the area-averaged brightness-related photometric parameter (Î) decreases in the radial direction towards the center axis at least for the continuous range (Δϕ) of the azimuth angle about the center axis, or wherein the bore region lighting unit includes a bore cover lighting unit comprising at least one lighting member arranged at the bore cover that is configured, in at least one state of operation, for generating lighting conditions at the bore cover, and at locations in the azimuthally arranged annular regions of the virtual plane, the area-averaged brightness-related photometric parameter (Î) increases at locations in the azimuthally arranged annular regions in a radial direction towards the center axis at least for the continuous range (Δϕ) of the azimuth angle about the center axis if the bore cover is at least partially illuminated by the bore cover lighting unit wherein each annular region covers a number of lighting members, wherein a shape of the lighting members at the outer surface of the front cover is selected from a group consisting of circular dots, radially arranged stripes and azimuthally arranged stripes.

11. A magnetic resonance imaging system configured for acquiring magnetic resonance images of at least a portion of a subject of interest, comprising:

an examination space disposed in a bore of a main magnet configured to generate a $B_0$ magnetic field in the examination space;

a bore cover disposed within and around the bore;

a front cover having an opening configured to pass at least the portion of the subject of interest into the examination space;

lighting members configured to illuminate the bore region and to light a region of the front cover around the opening, a shape of the lighting members at the outer surface of the front cover is selected from a group consisting of dots, radially arranged stripes and azimuthally arranged stripes; and wherein, at locations in azimuthally arranged annular regions of a virtual plane that is arranged perpendicularly to a center axis of the bore and in front of the front cover, an area-averaged brightness-related photometric parameter (Î) decreases with radial distance in the radial direction towards the center axis at least for a continuous range (Δϕ) of the azimuth angle about the center axis, or wherein at the locations in the azimuthally arranged annular regions of the virtual plane, the area-averaged brightness-related photometric parameter (Î) increases with radial distance in the radial direction towards the center axis at least for the continuous range (Δϕ) of the azimuth angle about the center axis.

* * * * *